(12) United States Patent
Shin et al.

(10) Patent No.: US 6,368,906 B1
(45) Date of Patent: Apr. 9, 2002

(54) METHOD OF PLANARIZATION USING SELECTING CURING OF SOG LAYER

(75) Inventors: Hong-jae Shin, Seoul; Ju-seon Goo, Kyungki-do, both of (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/209,317

(22) Filed: Dec. 9, 1998

(30) Foreign Application Priority Data

Sep. 12, 1997 (KR) .............................. 97-67080

(51) Int. Cl.$^7$ .......................................... H01L 21/8242
(52) U.S. Cl. ................ 438/210; 438/241; 438/239; 438/253; 438/396; 438/623; 438/624; 438/626; 438/631; 438/697; 438/699
(58) Field of Search ................. 438/210, 241, 438/239, 253, 396, 623, 624, 626, 631, 697, 699

(56) References Cited

U.S. PATENT DOCUMENTS

| | | | | |
|---|---|---|---|---|
| 5,364,811 A | * | 11/1994 | Ajika et al. .................. | 438/396 |
| 5,405,800 A | * | 4/1995 | Ogawa et al. ............... | 438/253 |
| 5,612,241 A | * | 3/1997 | Arima .......................... | 438/241 |
| 5,804,479 A | * | 9/1998 | Aoki et al. ................... | 438/253 |
| 5,913,150 A | * | 6/1999 | Takaishi ....................... | 438/782 |

* cited by examiner

*Primary Examiner*—Carl Whitehead, Jr.
*Assistant Examiner*—Toniae M. Thomas
(74) *Attorney, Agent, or Firm*—Marger Johnson & McCollom, P.C.

(57) ABSTRACT

A method for planarizing an interlayer dielectric layer formed on a semiconductor substrate having a step, using wet etch, by depositing first and second layers on the semiconductor substrate and selectively curing the second layer in the lower area using electron beams (E-beams). The second layer, e.g., an SOG layer formed of HSQ, has a lower etch rate during the wet etch in the cured area, to thereby easily planarize the substrate of the interlayer dielectric layer.

13 Claims, 2 Drawing Sheets

METHOD OF PLANARIZATION USING SELECTING CURING OF SOG LAYER

BACKGROUND OF THE INVENTION

1. Field of the Invention

The present invention relates to a semiconductor device and a method of manufacturing the same, and more particularly, to a semiconductor device in which a substrate having a step is planarized, and to a manufacturing method therefor.

2. Description of the Related Art

As integration of semiconductor devices increases, there is more need for an interconnection for a metallic multilayer. An intermetal dielectric (IMD) for insulating an under layer and an upper layer is very important for forming the multilayer interconnection. This is because planarization of the IMD affects a depth of focus (DOF) of a stepper used for a photolithography process, to thereby lower a total process margin. This problem is also present when planarizing an interlayer dielectric (ILD) layer.

The planarization of the IMD is a very important step when forming a metal interconnection of a DRAM and a merged DRAM logic device (MDL). This is because a complicated three-dimensional memory cell including a transistor and a capacitor is formed in a limited area. In general, to improve a capacitance, the surface area of a storage node of a capacitor is increased by being formed three dimensionally in the limited cell area of the semiconductor device. However, the three-dimensional storage node has a step higher than in the peripheral area, and such a step difference should be planarized in a later IMD forming process.

The IMD is typically planarized by depositing boron phosphor silicate glass (BPSG) and reflowing the deposited BPSG, depositing spin on glass (SOG) and etching the deposited SOG, or performing a chemical mechanical polishing (CMP) process.

The method for planarizing an IMD by depositing and etching SOG is disclosed in U.S. Pat. No. 5,631,197, entitled "Sacrificial Etchback Layer For Improved Spin-On-Glass Planarization," May 1997.

In the method, an SOG layer and a sacrificial layer are stacked on a semiconductor substrate, and the stacked layers are planarized by etchback. However, the method still has room for improvement to achieve a global planarization.

SUMMARY OF THE INVENTION

To solve the above problems, it is an objective of the present invention to provide a semiconductor device in which global planarization can be easily realized using wet etch, by depositing a SOG layer having a low step on a semiconductor substrate where a step is formed and curing the low-step SOG layer using electron beams (E-beams).

It is another objective of the present invention to provide a method of manufacturing a semiconductor device in which a substrate is planarized.

Accordingly, to achieve the first objective, there is provided a semiconductor device in which a substrate is planarized, including: a cell area having a high step formed on a first portion of a semiconductor substrate; a peripheral area having a lower step formed on a second portion of the semiconductor substrate, a first layer formed on the cell area and the peripheral area; and a second layer having different etch rates in the cell area and peripheral area due to curing performed only in a peripheral area.

Preferably, the first layer is thicker than a step formed between the cell area and the peripheral area, and the second layer formed on the first layer in the peripheral area is cured with electron beams (E-beams).

It is also preferable that the SOG is formed of hydrosilsesquioxane (HSQ), and the second layer is baked.

It is further preferable that the thickness of the second layer is 1000–10000 Å.

To achieve the second objective, there is provided a method of manufacturing a semiconductor device in which a substrate is planarized, including the steps of: forming first and second layers on a semiconductor substrate having a cell area and a peripheral area, forming a step therebetween; curing the second layer in the peripheral area; and etching back the semiconductor substrate after curing.

Preferably, the first layer is an insulating layer formed of one selected from the group consisting of undoped silicate glass (USG), boron phosphorus silicate glass (BPSG), phosphor silicate glass (PSG), boron silicate glass (BSG), SiOF, a nitride layer and inorganic spin on glass (SOG).

Also, the first layer is thicker than the step formed between the cell area and the peripheral area, the SOG is inorganic SOG formed of HSQ, and the thickness of the second layer is 1000–10000 Å.

The baking process is performed at a chamber temperature of 350–500° C. Also, the second layer over the cell area is cured by using a light shielding layer pattern of photoresist with an E-beam dose of 2000 $\mu C/cm^2$ or more, and power of 1 KeV or more. At this time, preferably, the temperature of the semiconductor substrate is 20–500° C.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

Figure 1:
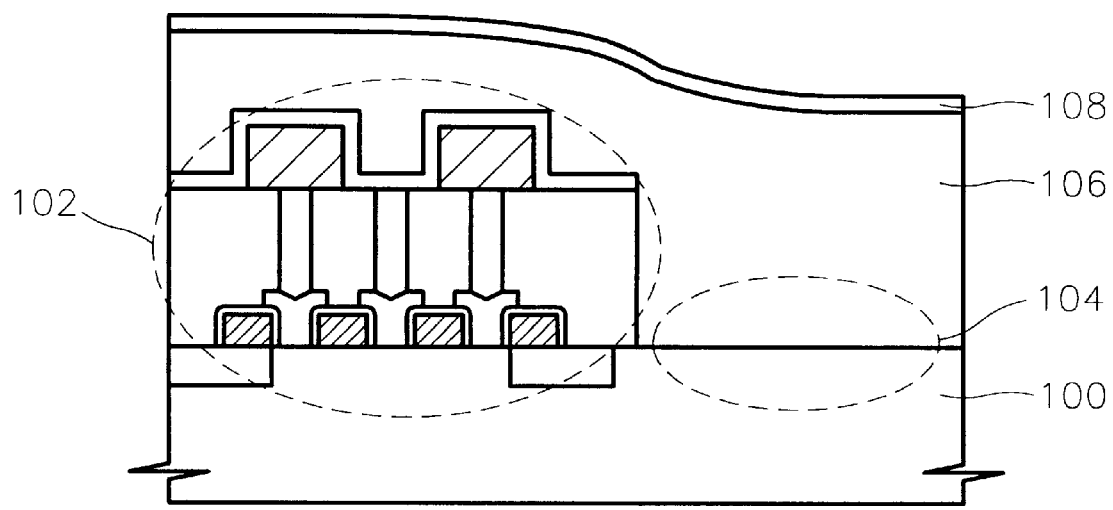
FIGS. 1 through 4 are sectional views for illustrating a semiconductor device in which a semiconductor substrate having a step is planarized according to the present invention, and a manufacturing method therefor.

The present invention may be embodied in many different forms, and should not be construed as being limited to the embodiments set forth herein. The term "etchback" used in the specification is not limited to a specific preferred etching method such as wet etch. Also, the second layer formed of inorganic SOG, i.e., HSQ in the specification, may be formed of organic SOG. The second layer, which is cured using a photoresist pattern as a light shielding layer, may be cured by the light shielding layer on a forming mask. In the drawings, the structure of a capacitor is a capacitor over bit line (COB) structure, but this is only an example. The structure of a capacitor described herein is therefore illustrative and not restrictive.

Figure 3:
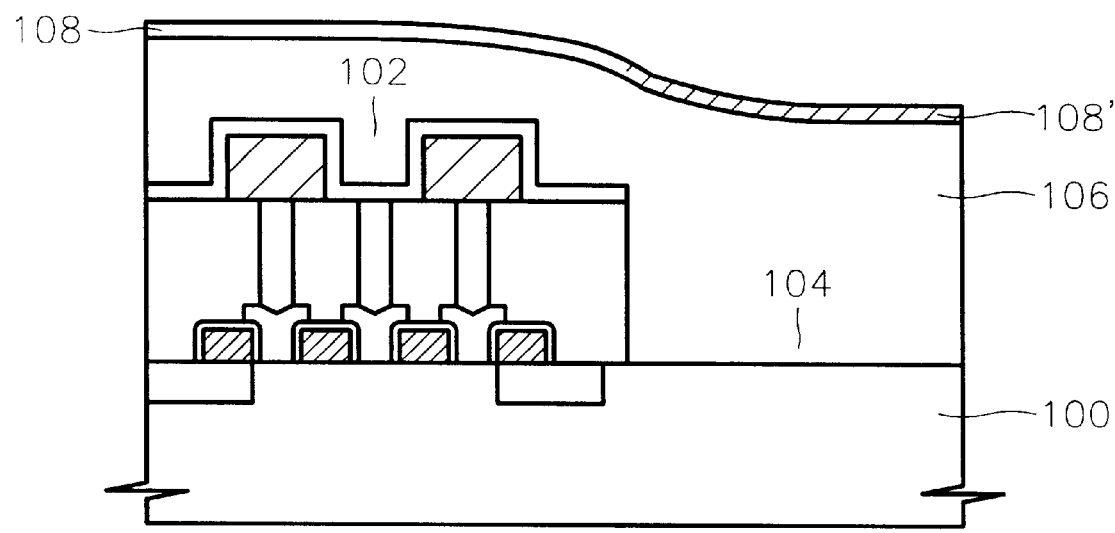

Referring to FIG. 3, a semiconductor device in which a substrate having a step is planarized according to an embodiment of the present invention will be described in detail. By conventional methods in which SOG is deposited and etching is performed to planarize a cell area and a peripheral area, it is very difficult to control the etching rates of various intermetal dielectrics (IMD) in the cell area and the peripheral area. Thus, the cell area, which is a higher step area of a three-dimensional structure, is damaged thereby deteriorating characteristics of the semiconductor device. However, according to the present invention, the IMD formed of SOG, e.g., hydrosilsesquioxane (HSQ), is cured using electron beams (E-beams) in the peripheral area having a low step, so that the etch rate in the peripheral area is different from that of the IMD in a cell area.

In FIG. 3, the semiconductor device in which a semiconductor substrate is planarized includes a cell area 102 having a high step consisting of capacitors and transistors on a semiconductor substrate 100, a peripheral area 104 having a low step formed on the semiconductor substrate 100 where the cell area does not exists, a first layer 106, e.g., an insulating layer, formed on the cell area 102 and the peripheral area 104, and a second layer 108 and 108' formed on the first layer 106 cured by E-beams in the peripheral area 104 to have an etching rate different from that in the cell area 102. In general, a step of 1 μm or more occurs between the cell area 102 and the peripheral area in a highly integrated DRAM or a merged DRAM logic (MDL). The first layer 106 is an insulating layer formed of either undoped silicate glass (USG), boron phosphor silicate glass (BPSG), phosphor silicate glass (PSG), boron silicate glass (BSG), SiOF, a nitride layer, or inorganic spin on glass (SOG), and is thicker than the step formed between the cell area 102 and the peripheral area 104. Preferably, the second layer 108 and 108' is formed of a baked HSQ layer.

Accordingly, when a light shielding layer such as a photoresist layer is selectively formed only on the cell area 102 of the baked second layer 108, e.g., the HSQ layer of 1000–10000 Å, and then E-beams are irradiated to the second layer 108' formed on the peripheral area, the second layer 108' is cured to thereby reduce the etching rate. For instance, when a buffered oxide etchant (BOE) is used as an etchant, the etching rate of 744 Å/min of a P-tetra ethyl ortho silicate (P-TEOS), which is used as a typical insulating material for the second layer 108', is changed to 532 Å/min by the irradiation of E-beams. Also, when $O_3$-TEOS is used as the insulating material layer of the second layer 108', the etching rate is changed from 1518 Å/min to 821 Å/min. However, when the SOG layer, e.g., the HSQ layer, is used for the second layer 108', the etching rate of 10,000 Å/min is remarkably reduced to 241 Å/min. When the thicknesses of the first and second layers 106 and 108' are controlled individually by using this large etching rate difference, the IMD formed on the cell area 102 and the peripheral area 104, having a high step is easily planarized using a typical wet etch method.

A method of manufacturing a semiconductor device in which a substrate is planarized according to the present invention will be described with reference to FIGS. 1 through 4.

FIG. 1 is a sectional view of a semiconductor substrate 100 where first and second layers 106 and 108 are formed. An under structure including a cell area 102 and a peripheral area 104 is formed on the semiconductor substrate 100. A capacitor of the cell area 102 is three-dimensional, so that a step from the peripheral area 104 where a transistor and a metal line are formed is 10000 Å or higher. A first layer 106 is deposited on the under structure. The first layer 106 is an insulating layer formed of either undoped silicate glass (USG), boron phosphor silicate glass (BPSG), phosphor silicate glass (PSG), a boron silicate glass (BSG), SiOF, a nitride layer, or inorganic spin on glass (SOG). Here, in the case of USG, BPSG, PSG, BSG or SiOF, the first layer 106 is formed using chemical vapor deposition (CVD). In the case of the nitride layer, the first layer 106 is formed using plasma enhanced CVD or low pressure CVD. Preferably, the first layer 106 is 10,000 Å thick or more, which is thicker than the step difference between the cell area 102 and the peripheral area 104. Subsequently, a second layer 108, e.g., an HSQ layer of an inorganic SOG, is formed on the resultant structure where the first layer 106 is formed, within a range of 1000–10,000 Åthick.

The inorganic SOG layer using HSQ has a higher crack resistance than the organic SOG layer in which cracks occur at 600° C. or higher. However, even if an organic SOG layer is used for the second layer 108, global planarization using the wet etch is realized. Subsequently, the resultant structure where the second layer 108 is formed is baked at 350–500° C. for a predetermined time to solidify the self-flowable second layer, e.g., HSQ layer.

Figure 2:
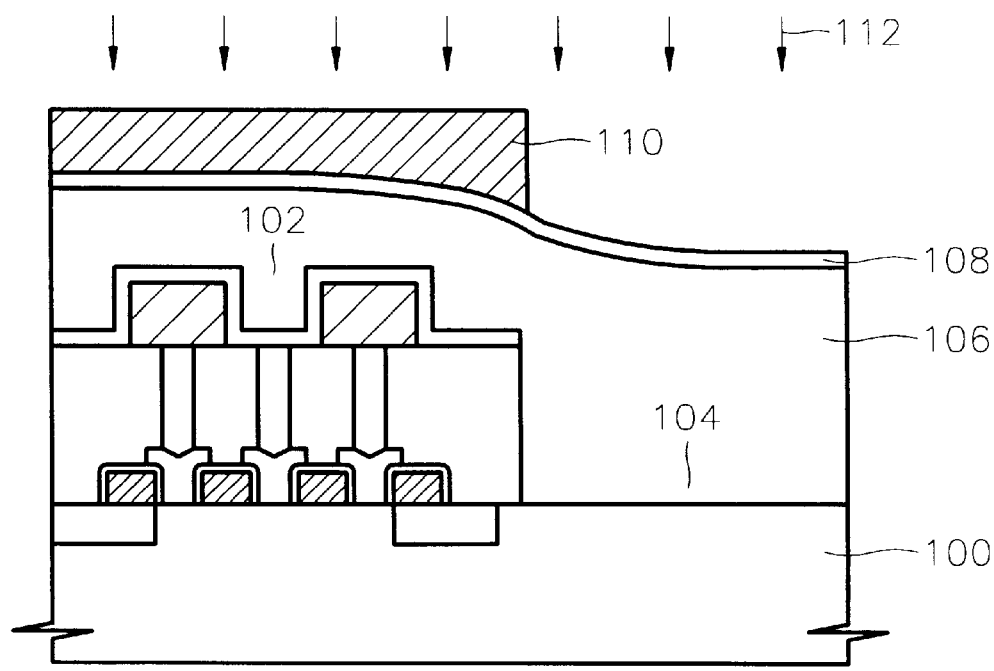

FIG. 2 is a sectional view of a semiconductor substrate having a light shielding layer pattern which is formed only on the cell area of the baked second layer. The entire surface of the second layer 108 is coated with photoresist. The photoresist over the peripheral area 104 is then moved through exposure and development to form a light shielding layer pattern 110 of photoresist on the surface of the second layer 108 over the cell area 102. Subsequently, the resultant structure is irradiated with E-beams 112 within a range of 25–500° C., with a dose of 2000 μc/cm$^2$ and a power of 1 KeV or higher, curing the exposed potion of layer 108.

FIG. 3 is a sectional view of a semiconductor substrate where a light shielding layer pattern is removed after irradiation of E-beams. When the light shielding layer pattern, e.g., the photoresist pattern is removed, a second layer 108 remains on the first layer 106 of the cell area 102. Thus, the etching rate of the second layer 108' over the peripheral area 104 is lower than the that of the second layer 108 over the cell area 102 due to the E-beam curing.

Figure 4:
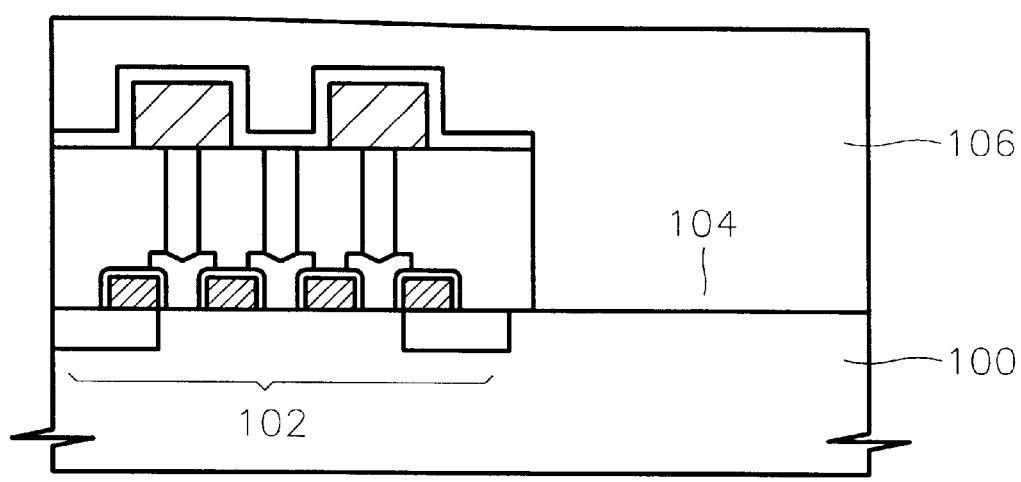

FIG. 4 is a sectional view of a semiconductor substrate where the second layers 108 and 108' having different etch rates are wet-etched to achieve a planarized inter metal dielectric (IMD). In detail, the resultant structure where the photoresist layer used as a light shielding layer was removed is wet-etched with BOE until no step remains between the insulating layers of the cell area 102 and the peripheral area 104. Here, the high step of the second layer 108 in the cell area 102 over the second layer 108' in the peripheral area 104 can be etched to an equal height. This is because the etch rate of the second layer 108' over the peripheral area 104, which has been cured by irradiation of E-beams, is 241 Å/min, and that of the second layer over the cell area 108, which has not been cured by irradiation of E-beams, is 10,000 Å/min. Thus, when the step formed on the semiconductor substrate is controlled by the thickness of the second layer 108 and the E-beam irradiation and the semiconductor substrate having a high step may be planarized using the simple wet etch.

According to the present invention, the IMD formed on the semiconductor substrate where a step is formed is the SOG layer formed of HSQ, and the etch rate of the SOG layer is controlled through curing using E-beams, to thereby easily planarize the substrate wet etch, and improve a process margin.

It should be understood that the invention is not limited to the illustrated embodiment and that many changes and modifications can be made within the scope of the invention by a person skilled in the art.

What is claimed is:

1. A method of manufacturing a semiconductor device, comprising the steps of:

providing a semiconductor substrate having a peripheral area and a cell area, the cell area raised relative to the peripheral area;

forming first and second layers on the semiconductor, the second layer having a first portion over the peripheral area and a second portion over the cell area and which is elevated relative to the first portion of the second layer;

selectively curing the first portion of the second layer, the cured first portion of the second layer having a lower etch rate than the second, uncured portion of the second layer; and etching the first and second portions of the second layer and a portion of the first layer.

2. The manufacturing method of claim 1, wherein the first layer is an insulating layer formed of one selected from the group consisting of undoped silicate glass (USG), boron phosphorus silicate glass (BPSG), phosphor silicate glass (PSG), boron silicate glass (BSG), SiOF, a nitride layer and inorganic spin on glass (SOG).

3. The manufacturing method of claim 1, wherein the first layer is thicker than the step formed between the cell area and the peripheral area.

4. The manufacturing method of claim 1, wherein the second layer is formed of SOG.

5. The manufacturing method of claim 4, wherein the SOG is inorganic SOG formed of HSQ.

6. The manufacturing method of claim 1, wherein the thickness of the second layer is 1000–10000 Å.

7. The manufacturing method of claim 1, wherein a baking process is further performed after formation of the second layer.

8. The manufacturing method of claim 7, wherein the baking process is performed at a chamber temperature of 350–500° C.

9. The manufacturing method of claim 1, wherein the step of curing the first portion of the second layer comprises the steps of:

coating the first and second portions of the second layer with photoresist;

patterning the photoresist and exposing first portion of the second layer; and curing the first portion of the second layer by E-beam irradiation.

10. The manufacturing method of claim 9, wherein the curing by E-beams is performed with a dose of 2000 $\mu C/cm^2$ and an energy of 1 KeV.

11. The manufacturing method of claim 9, wherein the curing using E-beams is performed at a wafer temperature of 25–500° C.

12. The manufacturing method of claim 1, wherein the etchback of the semiconductor substrate is performed by etching the first and second layers until the cell area is at the same level as the peripheral area.

13. The manufacturing method of claim 1, wherein the first and second layers are etched using wet-etching.

* * * * *

UNITED STATES PATENT AND TRADEMARK OFFICE
CERTIFICATE OF CORRECTION

PATENT NO. : 6,368,906 B1
DATED : April 9, 2002
INVENTOR(S) : Shin et al.

It is certified that error appears in the above-identified patent and that said Letters Patent is hereby corrected as shown below:

<u>Title page, Item [54] and Column 1, line 2,</u>
Title, "SELECTING" should read -- SELECTIVE --.

<u>Column 3,</u>
Line 12, "exists" should read -- exist --.

<u>Column 4,</u>
Line 6, "Åthick" should read -- Å thick --.
Line 24, "potion" should read -- portion --.

Signed and Sealed this

Thirtieth Day of July, 2002

*Attest:*

JAMES E. ROGAN
*Attesting Officer*     *Director of the United States Patent and Trademark Office*